United States Patent
Bohnert et al.

(10) Patent No.: US 9,310,399 B2
(45) Date of Patent: Apr. 12, 2016

(54) FIBER-OPTIC CURRENT SENSING USING A SENSOR WITH EXCHANGEABLE SUB-MODULES

(75) Inventors: Klaus Bohnert, Oberrohrdorf (CH); Andreas Frank, Zürich (CH); Robert Wüest, Zürich (CH)

(73) Assignee: ABB RESEARCH LTD, Zurich (CH)

(*) Notice: Subject to any disclaimer, the term of this patent is extended or adjusted under 35 U.S.C. 154(b) by 898 days.

(21) Appl. No.: 13/492,364

(22) Filed: Jun. 8, 2012

(65) Prior Publication Data
US 2012/0283969 A1  Nov. 8, 2012

Related U.S. Application Data

(63) Continuation of application No. PCT/EP2009/066977, filed on Dec. 11, 2009.

(51) Int. Cl.
| | | |
|---|---|---|
| *G01R 19/00* | (2006.01) | |
| *G01C 25/00* | (2006.01) | |
| *G01R 15/24* | (2006.01) | |
| *G01R 35/00* | (2006.01) | |

(52) U.S. Cl.
CPC .............. *G01R 15/246* (2013.01); *G01R 35/00* (2013.01); *G01R 15/247* (2013.01)

(58) Field of Classification Search
CPC ............................ G01R 31/00; G01R 15/246
USPC .......................... 702/64, 116; 356/139; 324/96
See application file for complete search history.

(56) References Cited

U.S. PATENT DOCUMENTS

| | | | |
|---|---|---|---|
| 4,797,607 A | | 1/1989 | Dupraz |
| 5,933,000 A | * | 8/1999 | Bosselmann et al. ........... 324/96 |
| 7,339,680 B2 | * | 3/2008 | Bohnert et al. ................ 356/483 |
| 2001/0050551 A1 | * | 12/2001 | Bohnert ................. G01R 15/24 |
| | | | 324/96 |

(Continued)

FOREIGN PATENT DOCUMENTS

| | | |
|---|---|---|
| EP | 1 107 029 A2 | 6/2001 |
| EP | 1 115 000 A2 | 7/2001 |

(Continued)

OTHER PUBLICATIONS

K. Bohnert et al., "Temperature and vibration Insensitive Fiber-Optic Current Sensor", Journal of Lightwave Technology, vol. 20, No. 2, Feb. 2002, pp. 267-276.

(Continued)

*Primary Examiner* — Michael Nghiem
*Assistant Examiner* — Eman Alkafawi
(74) *Attorney, Agent, or Firm* — Buchanan Ingersoll & Rooney PC

(57) ABSTRACT

A fiber-optic current sensor includes a measuring unit having a light source and a light detector, and a sensing head having a sensing fiber wound around a conductor and a retarder connected to the sensing fiber. The scale factor as a function of current of the fiber-optic current sensor is described by the product of two scaling functions fe' and fs' for the measuring unit and the sensing head, respectively. The data describing the scaling functions fe', fs' is stored in a memory of the measuring unit, while the data describing the scaling function fs' is also stored in a memory of the sensing head. Providing two such memory devices allows to store the scaling functions fe' and fs' separately, thereby turning the control unit as well as the sensor head into easily replaceable modules.

28 Claims, 6 Drawing Sheets

(56) References Cited

U.S. PATENT DOCUMENTS

| | | | |
|---|---|---|---|
| 2003/0117126 A1* | 6/2003 | Rahmatian | 324/96 |
| 2004/0239307 A1* | 12/2004 | Bohnert et al. | 324/76.11 |
| 2007/0052971 A1 | 3/2007 | Bohnert et al. | |
| 2009/0039866 A1* | 2/2009 | Bohnert et al. | 324/97 |
| 2009/0289617 A1* | 11/2009 | Bohnert | 324/96 |

FOREIGN PATENT DOCUMENTS

| | | |
|---|---|---|
| EP | 1 154 278 A2 | 11/2001 |
| EP | 1 491 903 A1 | 12/2004 |
| EP | 1 512 981 A1 | 3/2005 |
| FR | 2 613 838 A1 | 10/1988 |
| WO | WO 2005/111633 A1 | 11/2005 |
| WO | WO 2007121592 A1 * | 11/2007 |

OTHER PUBLICATIONS

Klause Bohnert et al., "Highly Accurate Fiber-Optic DC Current Sensor for the Electrowinning Industry", IEEE Transactions on Industry Applications, vol. 43, No. 1, Jan./Feb. 2007, pp. 180-187.

Klaus Bohnert et al., "Fiber-Optic Current Sensor for Electrowinning of Metals", Journal of Lighwave Technology, vol. 25, No. 11, Nov. 2007, pp. 3602-3609.

Y.N. Ying et al., "Recent progress in optical current sensing techniques", Rev. Sci. Instrum. 66 (5), May 1995, pp. 3097-3111.

Ralph A. Bergh et al., "An Overview of Fiber-Optic Gyroscopes", Journal of Lightwave Technology, vol. LT-2, No. 2, Apr. 1984.

H. Lefevre, "Principle of the Fiber-Optic Gyroscope", Artech house, Boston, London, 1993, 32 pages.

M. Lawrence, "Lithium noibate integrated optics", Rep. Prog. Phys. (1993), pp. 363-429.

Richard I. Laming et al., "Electric Current Sensors Employing Spun Highly Birefringent Optical Fibers", Journal of Lightwave Technology, vol. 7, No. 12, Dec. 1989, pp. 2084-2094.

International Search Report (PCT/ISA/210) issued on Aug. 31, 2010, by the European Patent Office as the International Searching Authority for International Application No. PCT/EP2009/066977.

Written Opinion (PCT/ISA/237) issued on Aug. 31, 2010, by the European Patent Office as the International Searching Authority for International Application No. PCT/EP2009/066977.

\* cited by examiner

FIBER-OPTIC CURRENT SENSING USING A SENSOR WITH EXCHANGEABLE SUB-MODULES

RELATED APPLICATIONS

This application claims priority as a continuation application under 35 U.S.C. §120 to PCT/EP2009/066977 filed as an International Application on Dec. 11, 2009 designating the U.S., the entire content of which is hereby incorporated by reference in its entirety.

FIELD

The present disclosure relates to a method for operating a fiber-optic current sensor, and to a fiber-optic current sensor for carrying out this method.

BACKGROUND INFORMATION

Fiber-optic current sensors have been described in References 1 to 7 identified in the list of references below. The references may hereinafter be identified in bracketed numbers (e.g., [1]) corresponding to the order in which the references are identified in the list of references. Generally, such a sensor consists of a sensor head, an optoelectronic measuring unit and a fiber cable in between. The sensor head includes a sensing fiber wound around the conductor whose current I is to be measured, and an optical retarder connected to the sensing fiber. The optical retarder causes a differential phase shift of approximately 90°, thereby converting between the linearly polarized light in the connecting fiber and the circularly polarized light in the sensing fiber. The magnetic field of the current I introduces a phase shift between the left and right circularly polarized light waves propagating in the sensing fiber. The optoelectronic measuring unit contains a light source and a light detector as well as a signal processor. Light from the light source is sent through the connecting fiber to the sensor head. Light returning from the sensor head is processed and measured by the light detector, and a signal S is derived therefrom. The signal processor calculates the current I from the signal S.

Generally, this calculation requires the knowledge of calibration data of the current sensor in order to account for the response and non-linearities of the sensor.

This type of sensor is often used in high-voltage environments, such as a substation of an electricity transmission and distribution network, and the sensor head is mounted at a high-voltage potential. For example, it may be placed on top of a free-standing electric insulator column or integrated in other high-voltage equipment, such as a circuit breaker. The optoelectronic measuring unit is placed at ground potential, for example, in an outdoor cabinet near the circuit breaker or in the substation control room.

SUMMARY

An exemplary embodiment of the present disclosure provides a method for operating a fiber-optic current sensor measuring a current I in a conductor. The current sensor includes a sensor head having a sensing fiber wound around the conductor and a retarder connected to the sensing fiber. The current sensor also includes a measuring unit having a light source and a light detector, and a polarization maintaining fiber connecting the sensor head to the measuring unit. The exemplary method includes sending light from the light source through the sensor head, and measuring, by means of the light detector, a signal S derived from light returning from the sensor head. In addition, the exemplary method includes calculating the current I from $$I=(S/g)\cdot f_e'(S)\cdot f_s'(S),$$

where
$f_e'(S)$ is a scaling function of the measuring unit depending on the signal S,
$f_s'(S)$ is a scaling function of the sensor head depending on the signal S, and
g is a constant independent of the signal S.

An exemplary embodiment of the present disclosure provides a fiber-optic current sensor for measuring a current I in a conductor. The exemplary sensor includes a sensor head having a sensing fiber wound around the conductor and a retarder connected to the sensing fiber, and a measuring unit including a light source and a light detector. The exemplary sensor also includes a polarization maintaining fiber connecting the sensor head to the measuring unit. In addition, the exemplary sensor includes a first memory attributed to the measuring unit for storing the measuring unit scaling function $f_e'$, and a second memory attributed to the sensor head for storing the sensor head scaling function $f_s'$. The light source is configured to send light through the sensor head, and the light detector is configured to measure a signal S derived from light returning from the sensor head. The current I is calculated from $$I=(S/g)\cdot f_e'(S)\cdot f_s'(S)$$

where
$f_e'(S)$ is a scaling function of the measuring unit depending on the signal S,
$f_e'(S)$ is a scaling function of the sensor head depending on the signal S, and
g is a constant independent of the signal S.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
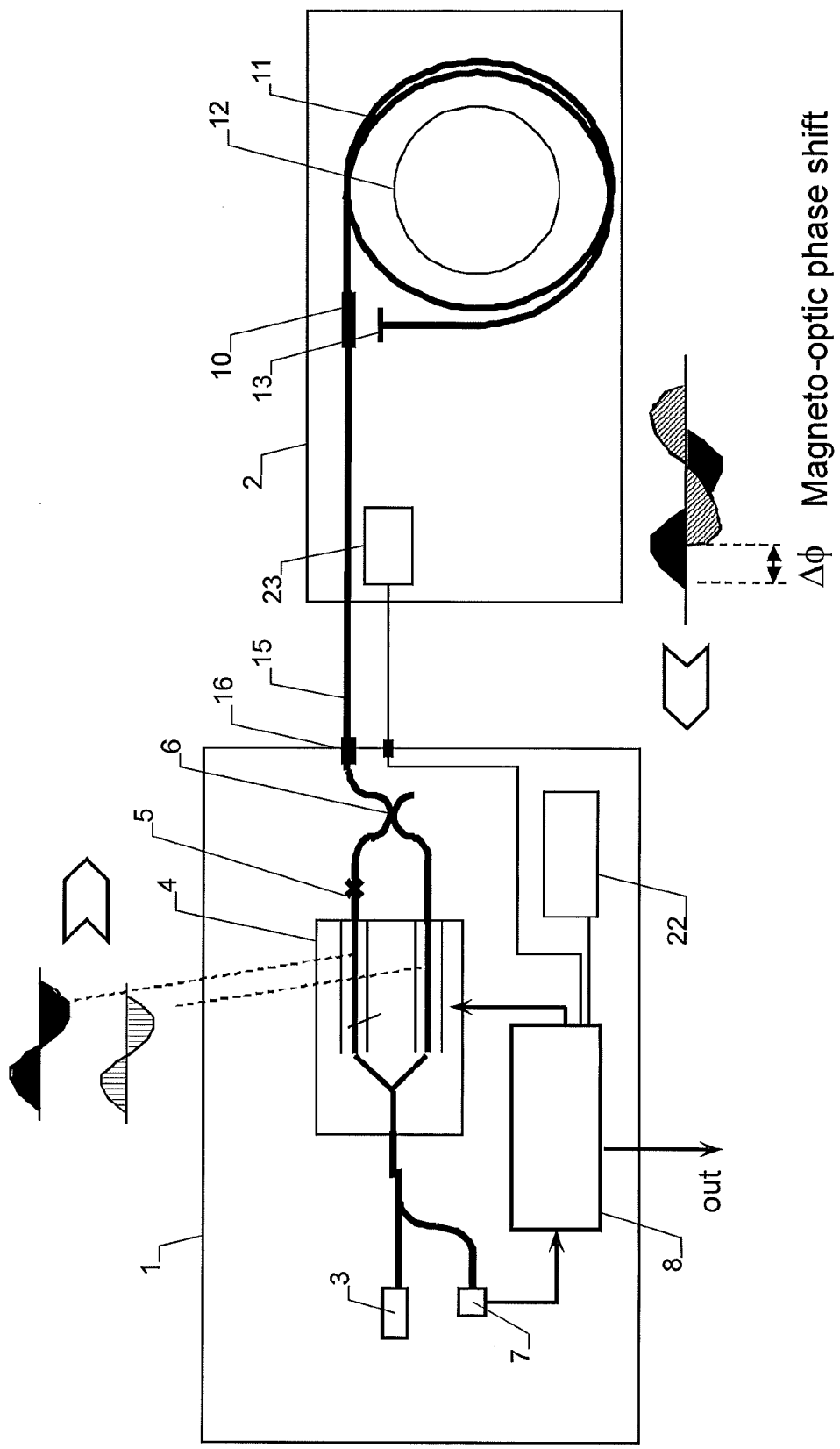
FIG. 1 shows an exemplary embodiment of a sensor.

Exemplary embodiments of the present disclosure provide a method for measuring a current by means of an optoelectronic current sensor and that allows for simple maintenance of the sensor.

An exemplary embodiment of the present disclosure provides a method for operating a fiber-optic current sensor measuring a current I in a conductor. The current sensor a sensor head having a sensing fiber wound around the conductor and a retarder connected to the sensing fiber, a measuring unit including a light source and a light detector, and a polarization maintaining fiber connecting the sensor head to the measuring unit. The exemplary method includes sending light from the light source through the sensor head, and measuring, by means of the light detector, a signal S derived from light returning from the sensor head. In accordance with the exemplary method, the current I in the conductor is calculated from the signal S according to $$I=(S/g) \cdot f_e'(S) \cdot f_s'(S)$$

with $f_e'$ being a scaling function of the measuring unit depending on the measured signal S (or, equivalently, the current I),
$f_s'$ being a scaling function of the sensor head, depending on the measured signal S (or, equivalently, the current I) and
g being a constant, independent of the signal S.

Furthermore, $f_e'(S)$ and/or $f_s'(S)$ may be affected by the temperatures $T_e$ and $T_s$ of the measuring unit and sensor head, respectively.

In other words, exemplary embodiments of the present disclosure are based on the understanding that the scaling function of the current sensor can be described as a product of a scaling function of the measuring unit and a scaling function of the sensor head. Hence, it becomes possible to exchange the measuring unit or sensor head without re-calibrating the sensor, as long as the replaced part comes with a description of its scaling function $f_e'$ or $f_s'$.

The scheme according to the present disclosure allows for the determination of the measuring unit scaling function $f_e'$ independently from the sensor head scaling function $f_s'$.

In general, nominally identical sensors may somewhat differ in their response as a result of imperfections of the sensor components and manufacturing tolerances. It has been discovered theoretically and experimentally, however, that the influence of such imperfections essentially disappears at a magneto-optic phase shift of π (and corresponding current). This point in the scaling function of the sensor may thus advantageously serve as an absolute reference for the calibration. Furthermore, it has been observed that imperfections reduce the interference fringe contrast particularly at small magneto-optic phase shifts (currents) and commonly enhance the sensor scale factor in this regime. The scale factor enhancement can therefore advantageously be derived from a measurement of the fringe contrast. With two points in the lower and upper range of the scaling function given in this way the whole function can be derived from a theoretical model. The procedure and modifications of it may be applied to the individual calibration of the measuring unit and sensor head.

The present disclosure also provides a fiber-optic current sensor for carrying out the method as described above. The sensor includes a sensor head having a sensing fiber wound around the conductor and a retarder connected to the sensing fiber, a measuring unit comprising a light source and a light detector, and a polarization maintaining fiber connecting the sensor head to the measuring unit.

Further, the sensor can include a first memory attributed to the measuring unit for storing the data describing the measuring unit scaling function $f_e'$, as well as the data describing the sensor head scaling function $f_s'$ and a second memory attributed to the sensor head for storing the data describing the sensor head scaling function $f_s'$.

Providing two such memory devices allows to store the scaling functions $f_e'$ and $f_s'$ separately, thereby turning the control unit as well as the sensor head into easily replaceable modules.

1. Sensor Configuration

The configuration of the sensor has been described in Refs. 1-7. An advantageous sensor version is shown FIG. 1. It includes a measuring unit 1 and a sensor head 2.

Measuring unit 1 includes a light source 3 and a y-type integrated-optic phase modulator 4. A 90° splice 5 is arranged at one of the outputs of phase modulator 4, after which the light waves are recombined in a polarization maintaining fiber coupler 6. The light coming back from sensor head 2 also passes phase modulator 4 and arrives at a light detector 7. A signal processor 8 is used to process the signal from photodiode 7 and to control the operation of phase modulator 4.

Sensor head 2 includes a retarder 10 and one or more loops of a sensing fiber 11. Sensing fiber 11 is wound around a current conductor 12, which carries the current I to be measured. A reflector 13 is arranged at the end of sensing fiber 11.

A polarization maintaining fiber 15 connects sensor head 2 and measuring unit 1. At its one end, it is connected, e.g. via a fiber connector 16, to coupler 6. At its other end, it is connected to retarder 10.

Figure 2:
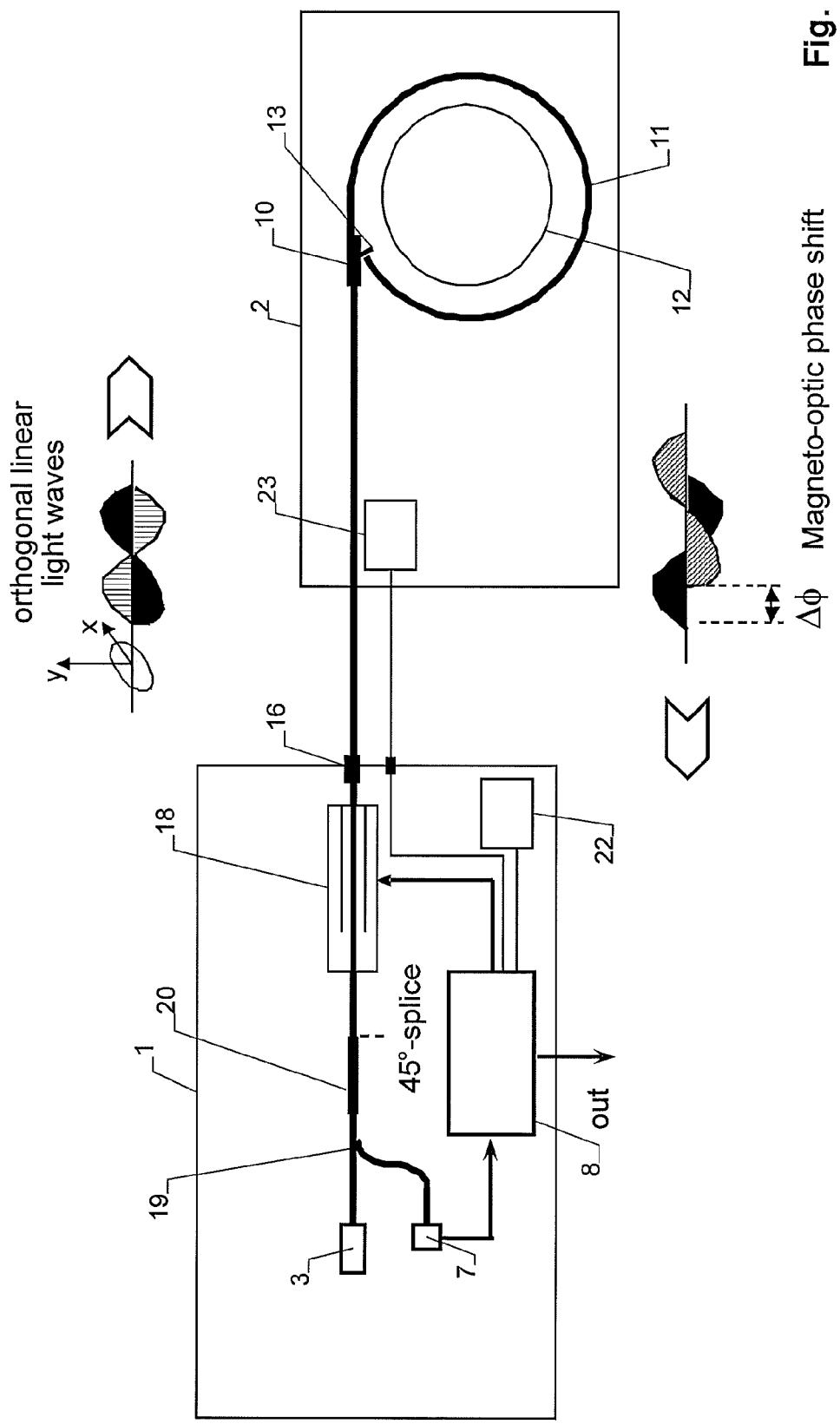
FIG. 2 shows an exemplary embodiment of a sensor.

Another somewhat simplified advantageous version is shown in FIG. 2. Here, the combination of the y-type integrated-optic phase modulator and the polarization-maintaining fiber coupler of FIG. 1 is replaced by an integrated-optic birefringence modulator 18, such as a $LiNbO_3$ differential phase modulator, which serves here as non-reciprocal phase modulator for light waves with orthogonal polarization directions. Light source 3 may be a broadband source, for example a superluminescent light emitting diode (SLED), whose light is depolarized in a fiber Lyot depolarizer (not shown). In the example of FIG. 2 the light is sent through a fiber coupler 19, and then polarized in a fiber polarizer 20. The polarized light is coupled into the polarization-maintaining (pm) fiber pigtail of the phase modulator 18 in such a way that the two orthogonal polarization modes of the pigtail (with polarization directions along the fast and slow fiber axes) are excited with about the same amplitudes. To this purpose the polarization direction of the light from the fiber polarizer is aligned at 45° with respect to the birefringent axes of the pigtail fiber. The pigtail axes in turn are aligned parallel to the electro-optic axes of the modulator. The two orthogonal light waves travel from the modulator to the sensing fiber through polarization-maintaining fiber 15. One or several loops of sensing fiber 11 enclose the current conductor 12. The orthogonal linear polarizations are converted into left and right circular polarizations at the near end of the sensing fiber 11 by means of a short section of polarization-maintaining fiber (for example, a elliptical-core fiber) acting as a quarter-wave retarder 10. At the far end of the fiber coil the circular light waves are reflected by reflector 13 and pass the coil a second time with swapped polarizations. The quarter-wave retarder 10 converts the returning circular waves back to orthogonal linear waves. Compared to the forward traveling linear waves, the polarization directions of the backward traveling linear waves are also interchanged. The magnetic field of the current I produces a differential phase shift Δφ proportional to the current I between the left and right circularly polarized light waves. As disclosed in Ref. 1, 4 the light waves in the sensing fiber 11 may be prepared with a defined elliptical polarization state instead of circular polarization in order to compensate for the temperature dependence of the Faraday effect. This is also true in the embodiment of FIG. 1.

The returning linearly polarized waves again pass modulator 18 and then are brought to interference at fiber polarizer 20. The interference signal is detected at the light detector 7. A closed-loop detection circuit including the modulator recovers the current-induced phase shift by a technique as known from fiber gyroscopes [9, 10]. The fiber 15 between the measuring unit and the sensor head is equipped with a polarization-maintaining fiber connector 16. The connector 16 simplifies the installation of the sensor and allows to separate measuring unit 1 from sensor head 2 in case replacement of one of the two components should be required. An alternative to a fiber connector is fiber splicing.

Sensing fiber 11 may be a standard single-mode fiber or a single-mode fiber produced with particular low intrinsic linear birefringence (low birefringence fiber). In accordance with an exemplary embodiment, the bare fiber resides in a thin capillary of fused silica in order to avoid fiber stress from a coating or from packaging [1, 3, 7]. Such stress could disturb the Faraday-sensitive (circular or elliptical) polarization of the light waves and deteriorate the performance of the sensor. The fiber coil may be thermally annealed in order to remove bend-induced linear fiber birefringence, or it may be a non-annealed fiber. In the latter case the bend-induced birefringence may be taken into account as described further below. As a further alternative the sensing fiber may be a highly birefringent spun fiber [13]. Here, the bend-induced linear birefringence is effectively quenched by an appropriate amount of circular birefringence built into the fiber.

In accordance with an exemplary embodiment, modulator 18 is a lithium niobate modulator with the waveguide produced by titanium in-diffusion into the lithium niobate substrate [11]. In the wavelength range of operation the waveguide supports the orthogonal polarization modes of the fundamental spatial mode (TE and TM modes). In accordance with an exemplary embodiment, the substrate is x-cut or z-cut (x-axis or z-axis perpendicular to the plane of the substrate, respectively). The light propagates in y-direction. In accordance with an exemplary embodiment, the fiber pigtail between polarizer 20 (45°-splice) and modulator 18 is chosen with a length sufficient to make the two orthogonal polarizations incoherent at the fiber end close to the modulator. Polarization-cross coupling at this fiber end (e.g. due to stress from holding the fiber) will then not disturb the interference of the light waves arriving at the detector. Furthermore, the fast and slow axes of the polarization-maintaining fibers are aligned parallel to fast and slow axes of the modulator 18, respectively, for similar reasons.

Instead of closed-loop detection, open-loop detection may be used. In case of open-loop detection a piezoelectric ceramic disk or tube with the fiber wrapped on its circumferential surface may be used as a modulator [1, 5].

Figure 3:
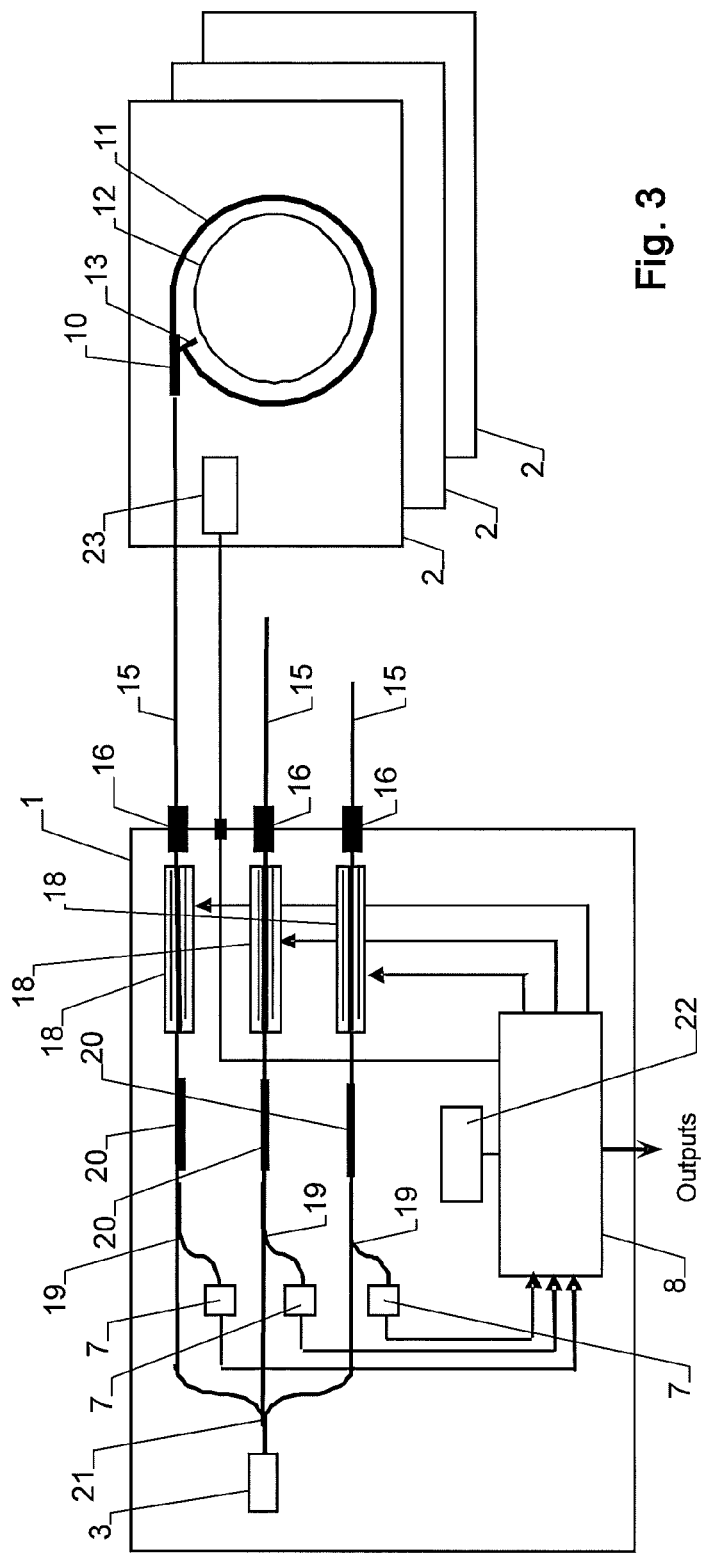
FIG. 3 shows an exemplary embodiment of a sensor.

FIG. 3 shows a sensor of the same type but having three sensor heads 2 operated with a common measuring unit 1, i.e. with a common light source 3 and a common signal processing unit 8. Here, the light from the common light source 3 is distributed onto the three channels by means of a 1×3 fiber coupler 21. In accordance with an exemplary embodiment, the subsequent 2×1 fiber couplers 19 are asymmetric couplers, for example with a coupling ratio of 0.8:0.2 instead of 0.5:0.5. As a result, the light power back-reflected from the sensor heads 2 into the source is reduced, here by a factor $(0.5 \times 0.5)/(0.2 \times 0.2) = 6.25$. Light source 3 is thus less prone to perturbations by back-reflected optical power.

2. Conventional Calibration

For an ideal sensor according to FIGS. 1-3 the current-induced optical phase shift is given by [1]

$$\Delta\phi = 4\phi_F = 4 \cdot V \cdot N \cdot I \quad (1)$$

Here, V is the Verdet constant of the sensing fiber, N is the number of sensing fiber loops around the conductor, and I is the electric current through the conductor. In eq. (1) it is particularly assumed that the sensing fiber is free of any birefringence and the retarder is a perfect quarter-wave retarder.

In a practical sensor there are several further issues which must be considered, however.

For one, the Verdet constant V depends on the wavelength $\lambda$, of the light source 3 (approximately in proportion to $1/\lambda^2$) and on temperature $(1/V)/(\partial V/\partial T) = 0.7 \times 10^{-4}$ °$C.^{-1}$.

In Ref. 4 a method has been disclosed where the temperature dependence of an appropriately prepared retarder is used to inherently compensate for the temperature dependence of the Verdet constant.

Furthermore, there are several causes which may lead to deviations from the simple relationship of eq. (1), see Ref. 3. As a result the raw signals of nominally identical sensors at a given current may differ within certain margins. The origins of these deviations include:

Imperfections of sensing fiber coil, e.g.
Bend-induced and/or intrinsic fiber birefringence,
Non-perfect integer loop number N
Temperature-compensation of the Faraday effect
Temperature-compensation according to Ref. 1, 4 works with a retarder that deviates from 90° by an amount ε. The proper value of ε depends on properties of the retarder fiber and in case of a non-negligible bend-induced birefringent phase retardation δ in the sensing fiber on the amount of δ and the orientation of the retarder axes β with respect to the plane of the fiber coil. A non-90°-retarder leads to a change in the scale factor which depends on ε, δ and β, and thus on the retarder fiber properties and coil parameters, and therefore may vary for different sensor coils [3].
Other retarder-related effects affecting the scale factor:
Retardation deviates from target due to manufacturing tolerances
Angle between the birefringent axes of the retarder and the axes of connecting fiber deviates from perfect 45°-angle
Tolerances in the orientation of retarder axes with respect to coil normal (axes of (residual) bend-induced fiber birefringence) [3].
Imperfections of the modulator
Polarization cross-coupling between orthogonal light waves within the modulator, at the fiber pigtails and fiber splices.
The modulator imperfections may vary as a function of temperature.
Imperfect fiber polarizer.
These imperfections affect the scale factor of the sensor and introduce nonlinearity in the signal-versus-current relationship. Furthermore, imperfections such as birefringence and polarization cross-coupling commonly vary with temperature and thus may contribute to the temperature dependence of the sensor.

Measuring unit 1 translates the current-induced phase shift $\Delta\phi$ into an electrical signal (digital word or analog current or voltage). This raw signal S is conventionally calibrated in units of primary current I (ampere) by sending a range of known currents through the sensor head and measuring the signal S as a function of current I: S=F(I). The calibration process commonly also includes temperature cycles for measuring unit 1 and sensor head 2 in order to account for the influence of temperature or to verify proper temperature compensation.

The process results in a set of calibration coefficients which enter into a (normalized) scaling function $f_c$. Function $f_c$ relates the detected differential magneto-optic phase shift $\Delta\phi$ to the primary current I according to:

$$\Delta\phi = 4 \cdot f_c(4\phi_F, T_s, T_e) \cdot \phi_F \qquad (2)$$

$$\Delta = \phi = 4 \cdot f_c(I, T_s, T_e) \cdot V \cdot N \cdot I \qquad (3)$$

Function $f_c$ accounts for any of the above mentioned imperfections, nonlinearities and temperature dependencies, if present. The wavelength dependence of the Verdet constant is considered further below. For the time being a standard wavelength $\lambda_o$ is assumed with $V = V(\lambda_o)$. In general, $f_c$ is a function of the current I or (equivalently) the signal S, the sensor head temperature $T_s$ and the measuring unit temperature $T_e$. Furthermore, $f_c$ may also vary somewhat with wavelength. For the purpose of this description all effects of wavelength are included in a common correction term (see below). For an ideal sensor (no imperfections) function $f_c(I, T_s, T_e)$ is equal to unity under all conditions.

The signal $S = F(I)$ is given by $$S = k \cdot \Delta\phi \qquad (4)$$

$$S = 4k \cdot f_c(I, T_s, T_e) \cdot V \cdot N \cdot I \qquad (5)$$

Factor k is a constant which, in case of digital electronics for example, sets a fixed relation between the least significant bit and the optical phase shift in terms of radians.

Equation (5) may be rewritten as $$S = g \cdot f_c(I, T_s, T_e) \cdot I \qquad (6)$$

with $g = 4 \cdot k \cdot V \cdot N$. $\qquad (7)$

For compensating temperature effects, the sensor may be equipped with one or several temperature sensors which measure $T_e$ and/or $T_s$.

The current I as a function of the sensor signal S is given by $I = F^{-1}(S)$ with $F^{-1}(S)$ being the inverse of function $F(I)$.

Current I may be written as $$I = (S/g) f_c'(S, T_s, T_e) \qquad (8)$$

with $f_c'(S, T_s, T_e)$ being a scaling function for the conversion of signal S into current I.

Commonly the deviations of $f_c$ and $f_c'$ from unity are small, i.e. $\Delta\phi \approx 4\phi_F$. Therefore, in good approximation $f_c'$ may be derived from $f_c$ by replacing in $f_c$ of eq. (2) the term $4\phi_F$ with the ratio $S/k$ ($= \Delta\phi$) and taking the inverse of $f_c$:

$$f_c'(S, T_s, T_e) \approx 1/f_c(S/k, T_s, T_e) \qquad (9)$$

A conventional calibration process is done for a sensor as a whole, i.e. sensor head 2 and measuring unit 1 are not calibrated individually. Since the mentioned imperfections differ from device to device, it is commonly not possible to exchange the measuring unit or a sensor head, for example in case of a component failure, without loosing to a certain degree the accuracy of the original calibration. Therefore, component failure in the field may require exchanging the complete sensor since on-site recalibration often may not be possible. Exchange of a complete sensor may be awkward, however, as the sensor head may be integrated in other high-voltage equipment, such as switchgear. As a result the full replacement of a sensor may require a shutdown of the equipment and an extended interruption of service.

Such interruption could be avoided, in particular if it were possible to replace the measuring unit without loss of sensor accuracy. (The measuring unit is considered to be more prone to failure than the sensor head, the latter consisting of passive components only.)

It is therefore an object of the present disclosure to disclose procedures which allow to calibrate the measuring unit and sensor head individually and to render it possible to exchange either component in the field without the need to recalibrate the sensor.

3. Individual Calibration of Measuring Unit and Sensor Head

Measuring unit 1 measures the phase shift $\Delta\phi$ and converts it into a digital quantity. By appropriate signal processing the digital signal is inherently calibrated in units of radian. The closed-loop signal processing circuit considered above, for example, applies a phase ramp to the modulator, the instantaneous slope of which is proportional to the instantaneous phase shift $\Delta\phi$ and current. In case of constant dc applied to the fiber coil the ramp voltage increases linearly with time until it reaches an upper limit. A control loop then resets the voltage by an amount equivalent to a phase shift $\Delta\phi$ of $2\pi$ (i.e. the working point is shifted to an adjacent interference fringe). Here, one makes use of the fact that the interference signal as function of $\Delta\phi$ has a periodicity of $2\pi$. The voltage step needed for a $2\pi$-reset represents a calibration of the voltage in terms of radians and thus defines the factor k. See Ref. 10 for details. Finally, the voltage is calibrated in units of current (Ampere) by sending a known current through the sensor head.

In case of open-loop signal processing the phase calibration may be derived from the first two or four harmonics of the modulation frequency seen at the detector.

According to the new calibration procedure function $f_c$ in Eq. 2-6 is replaced by a product $f_c = f_e \cdot f_s$ of individual scaling functions for the measuring unit and the sensor head, respectively. Similarly, function $f_c'$ in eq. 8, 9 is replaced by $f_c' = f_e' \cdot f_s'$. Eq. 8 then reads $$I = (S/g) f_e'(S, T_e) \cdot f_s'(S, T_s) \qquad (10)$$

As described in the following, the functions $f_e$, $f_s$ ($f_e'$, $f_s'$) can be determined independently of each other.

3.1 Calibration of the Measuring Unit

In the following, a number of different methods for calibrating the measurement unit, i.e. for determining the functions $f_e$, $f_e'$ are described.

a) Calibration Derived from Signal Vs. Current Measurement

Figure 4:
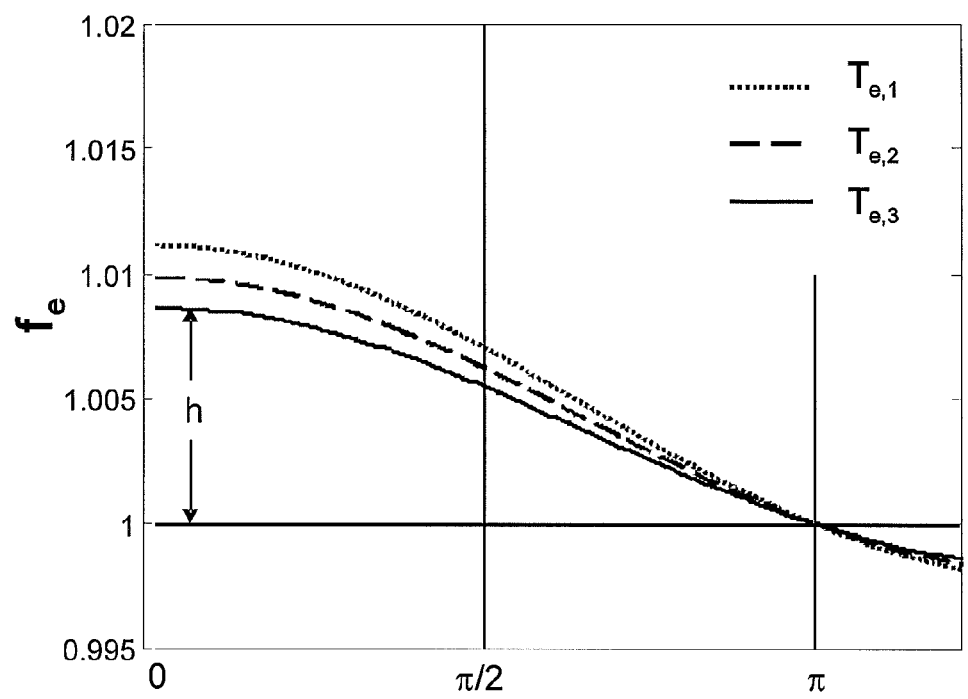
FIG. 4 shows an exemplary illustration of fe vs. the term $4\phi_F$ at three different temperatures $T_e$.
Figure 5:
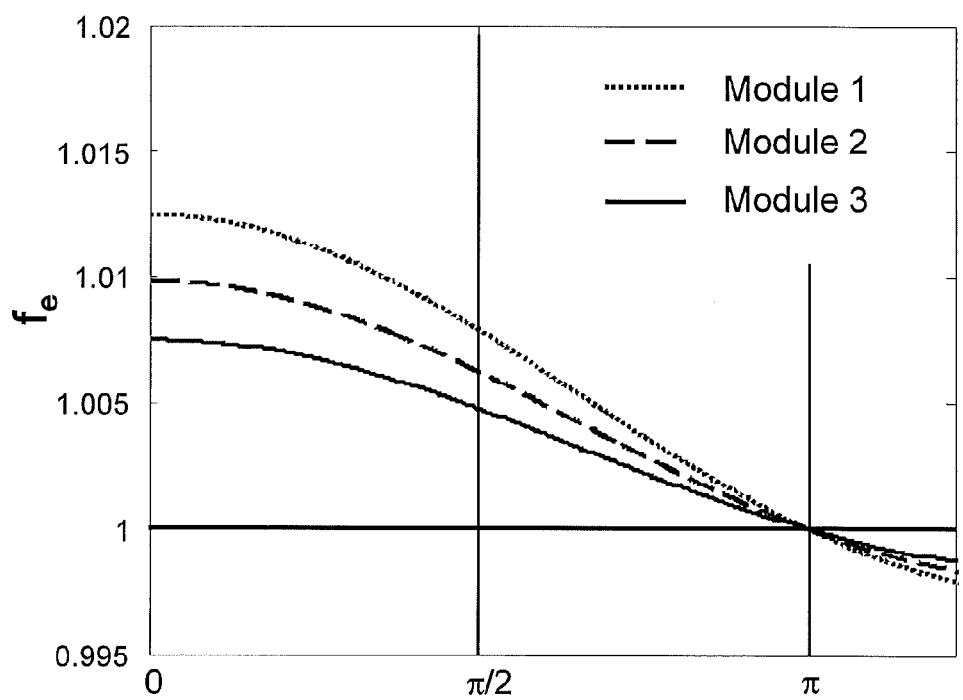
FIG. 5 shows fe at a constant temperature but for three different sensors.

FIG. 4 shows an exemplary illustration of $f_e$ vs. the term $4\phi_F = 4 \cdot V \cdot N \cdot I$ for various temperatures $T_e$ of measuring unit 1. Function $f_e$ may depend on temperature for reasons mentioned above. FIG. 5 shows $f_e$ at a constant temperature but for different measuring units. Similarly, the variation in the degree of imperfections from unit to unit may cause $f_e$ to differ as illustrated. In work leading to the present disclosure it has been found theoretically and confirmed experimentally that the influence of the imperfections largely disappears at a current-induced phase shift $4\phi_F = 4 \, V \, N \, I$ equal to multiples of $\pi$, i.e. at multiples of $\pi$ function $f_e$ is essentially equal to unity independent of $T_e$ and variations among individual sensors. The reason is that at such phase shifts the two orthogonal optical waves which are brought to interference (FIG. 1, 2) and parasitic waves generated by imperfections (e.g. polarization cross-coupling) superimpose each other in a way that the result resembles the two waves of an ideal sensor. Therefore the signal at $\pi$ (or multiples of $\pi$) can serve as an absolute reference. (Here, a requirement is that the birefringence of sensing fiber 11 is sufficiently small; see comment further below for the case of non-negligible birefringence).

For the purpose of calibration, measuring unit 1 is connected to a reference sensing head having a known sensor head scaling function $f_s$ or $f_s'$. Advantageously, the reference sensing head is ideal in the sense that $f_s=1$ (within the accuracy of interest), independently of current I. The coil of the reference sensing head is kept at a constant temperature (reference temperature $T_o$, i.e. $V=V(\lambda, T_o)$). The ideal coil is free of any linear birefringence and has a perfect quarter-wave retarder, i.e. $\epsilon=0°$. A coil with negligibly small birefringence may be realized with a single loop of fiber having intrinsically low birefringence and with sufficiently large loop diameter, for example 1.5 m. Bend-induced fiber stress and birefringence at this diameter may be considered as negligible. Assuming a loop diameter of 1.5 m, a fiber diameter of 80 μm, and a wavelength of 1310 nm the birefringent phase retardation is only about 0.6°. In accordance with an exemplary embodiment, the fiber is prepared and packaged as described in Ref. 3, 7 in order to avoid packaging-related stress. The generation of optical phase shifts of π at 1310 nm requires currents of about 750 kA in case of one fiber loop. This may be achieved, e.g. with 150 A of current in 5000 thousand conductor loops wrapped around the fiber.

The fiber retarder may be a short section of birefringent, elliptical-core fiber. In contrast to fibers with stress-induced birefringence, the retardation of this type of retarder has relatively little temperature dependence. The desired 90°-retardation may be approached from an initially larger start value, e.g. 95°, by a fine-tuning procedure as described in Ref. 1, 4, 12. A measure to determine when the retardation of 90° has been reached is as follows: After each fine-tuning step the retarder temperature is varied, e.g. between −20° C. and 100° C., and the resulting effect on the sensor signal at a given current is measured. A thermoelectric cooler/heater may be used for temperature control. The current is chosen such that $4\phi_F \ll \pi$, since the sensitivity of the signal to deviations of the retarder from 90° is largest if $4\phi_F$ is near zero. The phase retardation is at 90° when the influence of the retarder temperature on the sensor signal is at a minimum. This is due to the fact that the sensor scale factor varies approximately in proportion to $\epsilon^2$ with $\epsilon$ being the deviation of the retarder from 90° (Ref. 1, 4). Deviations from perfect signal linearity are well below 0.1% for a fiber coil prepared in this manner. Another criterion which may be used for retarder tuning is the fact that the signal (scale factor) reaches a minimum at a retardation of 90°. It is obvious that, if the retarder manufacturing is sufficiently well under control, extra fine-tuning may be avoided and the retarder may be produced directly with the desired 90°-retardation.

The calibration of the measuring unit involves the measurement of the sensor signal S as a function of current I (or $4\phi_F$) at selected temperatures $T_e$. The measurement yields the wanted terms $g \cdot f_e(I, T_e) = S/I$ and $(1/g)f_e'(S, T_e) = I/S$ (assuming $f_s=1$). With the parameter g known, the scaling functions $f_e(4\phi_F, T_e)$ and $f_e'(S, T_e)$ are then also known. Note: For calibration it is sufficient to determine the products $g \cdot f_e$ $(1/g) \cdot f_e'$, i.e. explicit knowledge of g is not required. In a simple approach, the values of the scaling function $f_e(I, T_e)$ (or equivalently of $f_e'(S, T_e)$) can be determined for a plurality of current values I (or, equivalently, for a plurality of signal values S) and temperatures $T_e$ and the obtained values may be stored in a look-up table. The look-up table is then used to calculate current I from measured signal S and temperature $T_e$.

Often, and in combination with any method for determining functions $f_e$, $f_e'$, it may be sufficient to measure, in a first step signal S vs. current I at a single given temperature $T_o$, e.g. room temperature, and, in a second step, to measure S vs. temperature $T_e$ at a selected (given) current $I_o$, e.g. at the rated current. The function $f_e(I, T_e)$ is thus approximated by a product of two functions:

$$f_e(I, T_e) = f_e(I, T_o) \cdot f_e(I_o, T_e)/f_e(I_o, T_o) \tag{11}$$

Likewise, function $f_e'(S, T_e)$ for converting a signal S into current I is given by:

$$f_e'(S, T_e) = f_e'(S, T_o)f_e'(S_o, T_e)/f_e'(S_o, T_o) \tag{12}$$

The current I is then calculated from the raw signal S as follows:

$$I = (S/g)[f_e'(S, T_o)f_e'(S_o, T_e)/f_e'(S_o, T_o)] \cdot f_s'(S, T_s) \tag{13}$$

Function $f_e'(S, T_o)$ may be represented as a polynomial as follows:

$$f_e'(S, T_o) = a_o + a_1 abs(S) + a_2 S^2 + a_3 abs(S)^3 + \tag{14}$$

Likewise $f_e'(S_o, T_e)$ may be represented by a polynomial as follows:

$$f_e'(S_o, T_e) = f_e(S_o, T_o)[1 + b_1(T_e - T_o) + b_2(T_e - T_o)^2 + b_3(T_e - T_o)^3 + \ldots] \tag{15}$$

Alternatively, the functions $f_e'(S, T_o)$ and $f_e'(S_o, T_e)$ may again be stored in look-up tables.

As a further alternative, the functions may also be represented by spline curves.

Depending on the magnitude of the temperature effect, the required temperature range of operation, and the required accuracy it may be sufficient to determine $f_e$ vs. current I only at a single temperature, commonly room temperature.

As noted above the procedure does not require an explicit determination of the parameter $g = k \cdot V \cdot N$. In principle it is sufficient to determine the product of g and $f_e(I, T_e)$. If desired the value of g may be determined from the measured signal and the applied current at $4\phi_F = \pi$, where $f_e = 1$. (As noted the scaling function of the fiber coil $f_s$ is equal to unity independent of the current assuming an ideal coil). With the Verdet constant V and number of fiber loops N known the procedure then also represents an independent verification of the factor k (in addition to the self-calibration mentioned above).

For the purpose of the present description and the claims, the terms $f_e$ and $g \cdot f_e$ can be used interchangeably. In other words, when it is e.g. claimed that $f_e$ is measured, this is to be understood that either $f_e$ is measured explicitly, or $g \cdot f_e$ is measured.

b) Calibration Derived from the Interference Fringe Visibility

Figure 6:
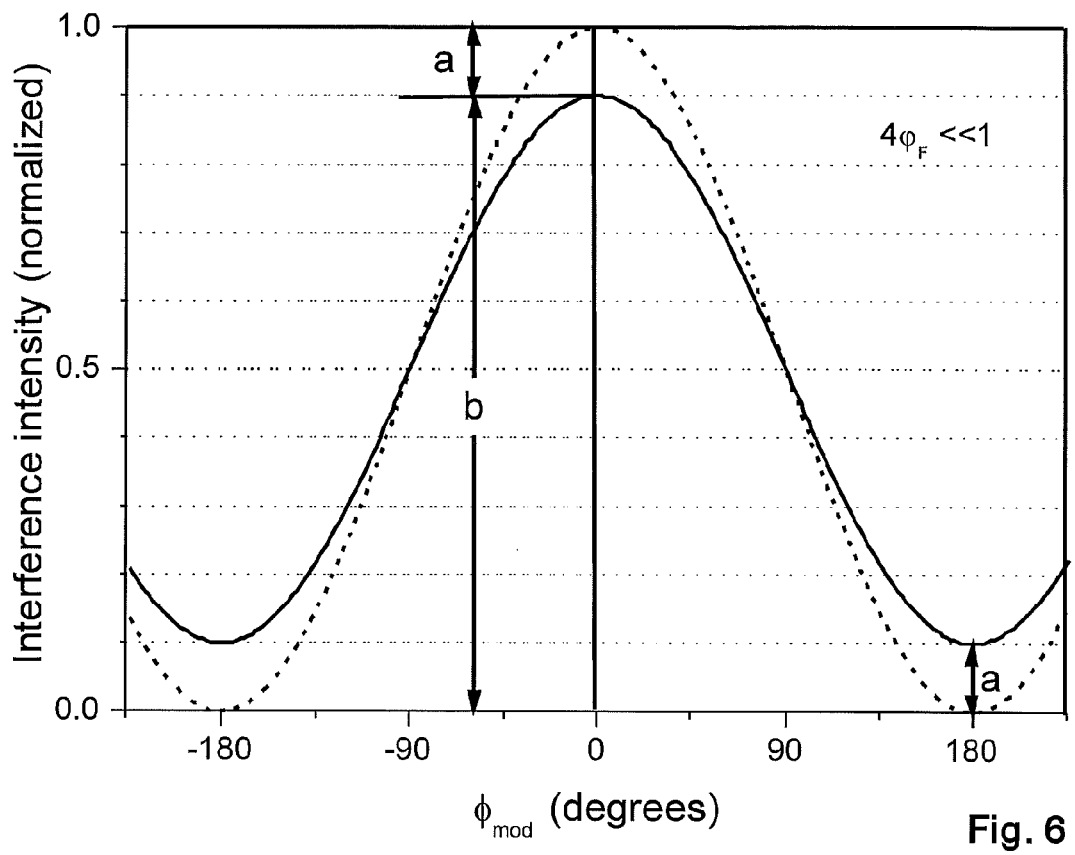
FIG. 6 shows the normalized interference intensity vs. the phase shift $\phi_{mod}$.

The measuring unit is again connected to an ideal fiber coil, i.e. $f_s$ is equal to unity independent of current at a reference temperature $T_o$. In contrast to the procedure in the previous section the calibration is done without the need of actually applying a current. (Instead of a complete coil a short section of sensing fiber with a reflector would therefore already be sufficient). Instead, function $f_e$ is determined from the interference fringe visibility at zero current and the information that $f_e = 1$ at a current corresponding to $4\phi_F = \pi$. The above mentioned imperfections (polarization cross coupling) introduce nonlinearity as illustrated in FIG. 4, 5 and at the same time reduce the fringe visibility. FIG. 6 shows the normalized interference intensity vs. the phase shift $\phi_{mod}$ introduced by the non-reciprocal phase modulator for an ideal sensor (dashed line) and a sensor with imperfections (polarization-cross coupling within the measuring unit, solid line). It is assumed that the magneto-optic phase shift $4\phi_F$ is zero or near to zero. At $4\phi_F = \pi$ the fringe visibility v, defined as $v = (b-a)/(a+b)$ with a, b as defined in FIG. 6, is close to unity (even in the presence of the imperfections), i.e. the interference intensity vs. $\phi_{mod}$ essentially follows the dashed line in FIG. 6. It can be shown that, at zero current, the normalized intensity offset a at $\phi_{mod}=\pi$ (180°) is equal to the offset h from unity of the function $f_e$ at the given temperature $T_e$ (see FIG. 4). More generally, h is given as: h=p·a, where the parameter p may depend on specifics of the optical components and may be determined experimentally. In the following it is assumed that p equals p=1. Knowing $f_e$ at $4\phi_F=0$ ($f_e=1+h$) and at $4\phi_F=\pi$ ($f_e=1$), function $f_e$ can be determined for the whole range of magneto-optic phase shifts and currents. Following the formalism outlined in Ref. 3, function $f_e$ may be expressed in the present case as $$f_e = \Delta\phi/(4\phi_F) \tag{17}$$

with $$\Delta\phi = \arctan\frac{2U}{1-U^2} \tag{18}$$

$$U = \frac{\tan(2\varphi_F)}{\cos\gamma} \tag{19}$$

$$\cos\gamma = (1/h) \tag{20}$$

Thus, with the parameter h determined experimentally as described, function $f_e$ can be calculated as a function of $4\phi_F$ and equivalent currents $I=\phi_F/VN$. The procedure may be repeated for various temperatures of the measuring unit in order to determine the variation of $f_e$ with temperature, if there is any, i.e. $f_e(I, T_e)$ (as well as $f_e'(S, T_e)$). Here, the parameter g is considered as known and constant for all sensors of a given type.

Hence, the parameter h can be determined from the interference fringe visibility. The interference fringe visibility is, in turn, measured by operating modulator 4 or 18 for introducing a phase shift between the light polarizations emitted by measuring unit 1, thereby generating the interference fringes at light detector 7.

With function $f_e=f_e(4\phi_F)$ or equivalently $f_e=f_e(I)$ at given temperatures $T_e$ determined function $f_e'(S)$ may be approximated according to eq. (9) by replacing in the relationship $f_e=f_e(4\phi_F)$ the term $4\phi_F$ with the term S/k (S/k=$\Delta\phi\approx 4\phi_F$) and then taking the inverse of function $f_e$:

$$f_e'(S) = 1/[f_e(S/k)] \tag{21}$$

c) Calibration Derived from Scale Factor at Small Currents

Instead of deriving the zero (or small) current value of $f_e$ (and $f_e'$) from the fringe visibility the parameter h may be determined by applying a small current, i.e. $4\phi_F \ll 1$ (again using the ideal coil from above). The remaining procedure is as in section b. In particular, measuring unit 1 is again connected to an ideal sensing head having a sensing head scaling function $f_s=1$. The sensing fiber of the ideal sensing head is wound around the conductor carrying the current I.

d) Calibration Derived from Polarization Crosstalk at Phase Modulator

Commonly, function $f_e$ is mainly determined by the polarization cross-talk (PCT) at the phase modulator and its fiber pigtails (light coupling between the ordinary and extraordinary axes). Therefore, it may often be sufficient to simply measure the modulator crosstalk and its temperature dependence and derive the parameter h and thus functions $f_e$, $f_e'$ as follows:

The polarization crosstalk is defined as $$\text{PCT} = 10\cdot\log(P_y/P_x) \tag{22}$$

Here, it is assumed that linearly polarized light is launched into the entrance fiber pigtail of the modulator with its polarization parallel to a birefringent fiber axis (here x). $P_y$ and $P_x$ refer to the optical power detected at the exit pigtail for polarization directions parallel to x and y, respectively.

For sufficiently small PCT the parameter h is then given as h=2 ($P_y/P_x$) and $f_e$ at $4\phi_F=0$ is again given as $f_e=1+h$.

Note: From the above it is clear that the calibration of measuring unit 1 according to the above procedures can also be done with a non-ideal coil (that is $f_s$ differs from unity) if $f_s$ as a function of the current I and temperature $T_s$ is known. Function $f_s(I, T_s)$ of a non-ideal coil may be determined by one of the methods described below.

3.2 Calibration of the Sensing Head

The scaling function of an ideal sensing head is equal to unity ($f_s=1$), independent of the current magnitude, i.e. the magneto-optic phase shift $\Delta\phi$ increases perfectly linearly with current I. A preferred design of the sensing head intentionally uses a non-90°-retarder (e.g. retarder with a retardation of 100°). By choosing a proper retardation, the temperature dependence of the retardation and its effect on the sensor scale inherently balance the temperature dependence of the Verdet constant [1]. An extra temperature sensor at the fiber coil for temperature compensation can be dispensed with.

As mentioned above a non-90°-retarder introduces a certain amount of non-linearity in the sensor response. Furthermore, the scaling function is affected by bend-induced or intrinsic birefringence in the sensing fiber and, if such birefringence is present, by the orientation of the retarder axes to the normal of the fiber coil. The effects must be accounted for if excellent sensor accuracy over wide current ranges is required. The phase shift $\Delta\phi$ may be written as [3]

$$\Delta\phi = \arctan\frac{2U}{1-U^2} \tag{23}$$

with $$U = \frac{2\varphi_F \frac{\tan\Gamma}{\Gamma}}{\cos\varepsilon - \delta'\sin\varepsilon\,\sin\,[2(\beta+\psi)]\frac{\tan\Gamma}{\Gamma}}, \tag{24}$$

$$\delta' = \{\delta^2 + \delta_i^2 + 2\,\delta\,\delta_i\,\cos[2(\beta_i-\beta)]\}^{1/2}, \tag{25}$$

$$\Gamma = [\delta'^2 + (2\varphi_F)^2]^{1/2}, \text{ and} \tag{26}$$

$$\psi = \arctan\frac{\delta_i\,\sin\,[2(\beta_i-\beta)]}{\delta + \delta_i\,\cos\,[2(\beta_i-\beta)] + \delta'} \tag{27}$$

Scaling function $f_s$ is then calculated according to $$f_s = \Delta\phi/(4\phi_F) \tag{28}$$

Figure 7:
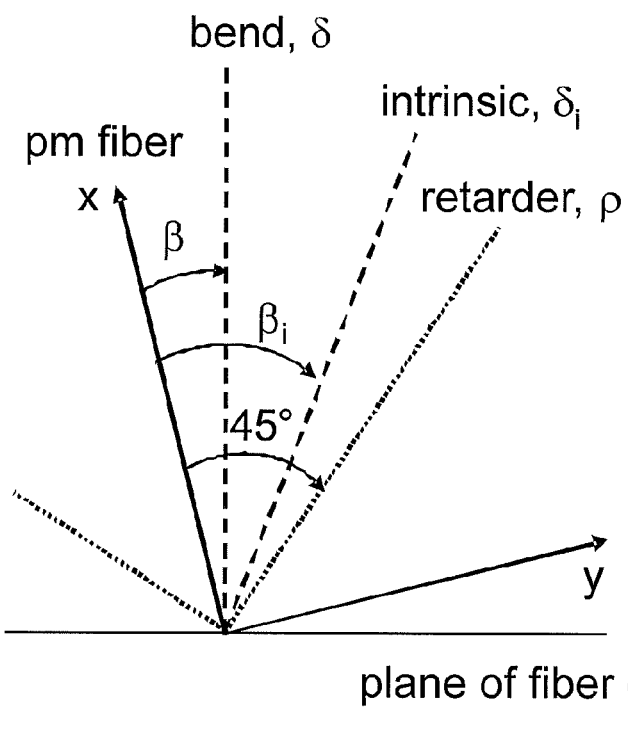
FIG. 7 shows angles between the axes of the sensing fiber and the retarder axes.

Here, $\delta$ and $\delta_i$ denote the birefringent phase retardation in the sensing fiber due to bend-induced and intrinsic birefringence, respectively. The angles $\beta$ and $\beta_i$ are the angles between a principal axis of the polarization-maintaining fiber lead and the slow axes of the bend-induced and intrinsic birefringences, respectively (FIG. 7). The slow axis of the bend-induced birefringence coincides with direction of the normal of the fiber coil. Often, the intrinsic birefringence can be assumed as negligible ($\delta_i=0$). The above equations then reduce to $$\Delta\phi = \arctan\frac{2U}{1-U^2} \tag{29}$$

with

-continued $$U = \frac{2\varphi_F \frac{\tan \Gamma}{\Gamma}}{\cos \varepsilon - \delta \sin \varepsilon \sin(2\beta) \frac{\tan \Gamma}{\Gamma}} \quad (30)$$

$$\Gamma = [\delta^2 + (2\varphi_F)^2]^{1/2} \quad (31)$$

The birefringent phase retardation $\delta$ per fiber turn (rad/turn) due to bend-induced birefringence is given by (Ref. [3] and references therein):

$$\delta = (2\pi^2/\lambda) \cdot E \cdot C \cdot (r^2/R). \quad (32)$$

Here, r, R denote the fiber and loop radii, respectively. $E = 7.5 \cdot 10^{10}$ Pa and $C = -3.28 \cdot 10^{-12}$ Pa$^{-1}$ are Young's modulus and the stress-optic coefficient, respectively, and $\lambda$ is the wavelength of operation.

Figure 8:
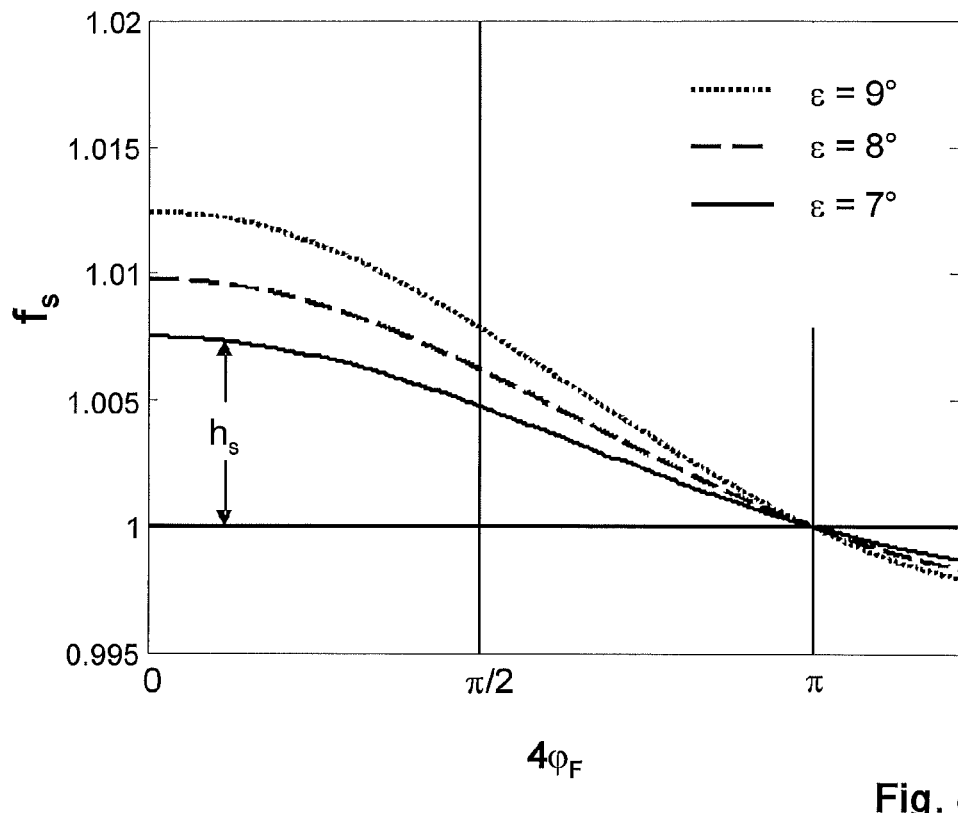
FIG. 8 shows function fs vs. the term $4\phi_F$ for three retarders.

FIG. 8 shows theoretical results for function $f_s$ for three retarders with different deviations $\epsilon$ from 90° ($\epsilon = 7°, 8°, 9°$). The sensing fiber is assumed to be free of any birefringence ($\delta = 0$, $\epsilon_i = 0$). The curves are then independent of the retarder orientation. Again function $f_s$ is equal to unity at phase shifts $4\phi_F = \pi$ (or multiples of $\pi$).

Figure 9:
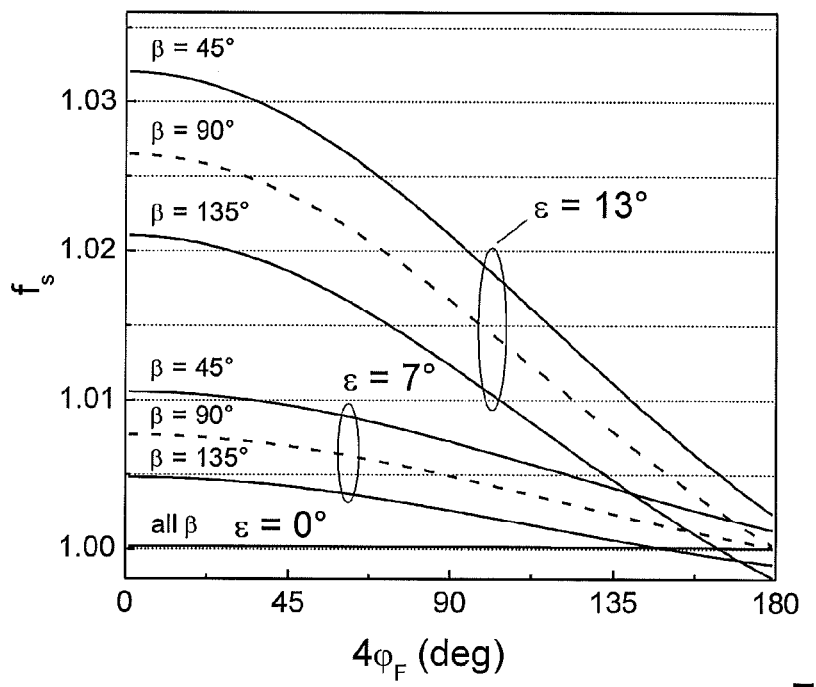
FIG. 9 shows function fs vs. $4\phi_F$ for $\epsilon=0°$, $7°$, $13°$ and different retarder orientations $\beta$.

FIG. 9 shows $f_s$ vs. $4\phi_F$ for $\epsilon = 0°, 7°, 13°$ for a fiber coil with a birefringent phase retardation of $\delta = 1.33°$ ($\delta_i = 0°$). (Such a retardation is produced e.g. in a single fiber loop with a radius of 0.82 m, a fiber diameter of 80 μm, and a wavelength of 820 nm). It is seen that the curves are now affected by the retarder orientation. The curves for $\beta = 45°$, 90°, and 135° correspond to orientations of the slow retarder axis parallel, at 45°, and perpendicular to the normal of the fiber coil, respectively. It is also evident that the curves now deviate somewhat from unity at $4\phi_F = 180°$. The deviations are smallest if the retarder axes are at 45° to the normal of the fiber coil (i.e. for $\beta = 90°$). For non-zero birefringence $\delta$ function $f_s$ still equals unity at magneto-optic phase shifts $4\phi_F$ corresponding to even multiples of $\pi$, but may significantly deviate from unity at odd multiples of $\pi$ in case of non-negligible values of $\delta$.

Note: Since the retardation $\rho$ of the retarder and the birefringence $\delta$ depend on the wavelength of the light source, function $f_s$ is also somewhat wavelength dependent (see section 3.3).

In the following, a number of different methods for calibrating the sensor head, i.e. for determining the function $f_s$, are described.

a) Coil Calibration Derived from Signal Vs. Current Measurement

The fiber coil is connected to a measuring unit calibrated as described above, i.e. measuring unit scaling functions $f_e$, $f_e'$ are known. The scaling functions $f_s$ (or the product of g and $f_s$) and $f_s'$ are determined by applying a range of currents and measuring the resulting signal S.

b) Coil Calibration Derived from the Interference Fringe Visibility

The fiber coil is connected to a calibrated measuring unit with known parameters $a_e$ and $h_e$. The scaling function $f_s$ at zero current is then determined from the normalized intensity offset a at $\phi_{mod} = \pi$. The offset now consists of contributions $a_e$ and $a_s$ from the measuring unit and fiber coil respectively: $a = a_e + a_s$ or $a_s = a - a_e$. Function $f_s$ near zero current is then given as $f_s = 1 + h_s$ with $h_s = a_s$. Function $f_s$ is then determined for the entire current range according to the equations above. Again, the parameter g is considered as known and constant for all sensors of a given type. Equivalently to eq. (21) function $f_s'$ is then given $$f_s'(S) = 1/[f_s(S/k)] \quad (33)$$

In particular, if the bend-induced birefringent phase retardation $\delta$ (as well as $\delta_i$) are negligible, function $f_s(I=0) = 1 + h_s$ (corresponding to $\phi_F = 0$) can be inserted into eqs. (28)-(31) in order to calculate the value of $\epsilon$. Therefrom, $f_s$ can be calculated for any values of I again using eqs. (28)-(31).

If $\delta$ is non-negligible, it can be calculated from eq. (32) if r and R are known. At least one of the parameters $\beta$ or $\epsilon$ should be known (at least approximately) from the manufacturing process. If for example $\beta$ is known, $\epsilon$ can be calculated by inserting $f_s(I=0) = 1 + h_s$ in eqs. (23)-(28). Therefrom, $f_s$ can be calculated for any values of I using eqs. (23)-(28). If $\epsilon$ is known, $\beta$ can be calculated and $f_s$ can again be calculated using eqs. (23)-(28).

c) Coil Calibration Derived from Scale Factor at Small Currents

Instead of measuring the fringe visibility at zero current the scaling function $f_s$ at small magneto-optic phase shifts ($4\phi_F \ll 1$) is determined by applying a small current. The remaining procedure is as in section b. In this case the value of $\epsilon$ (or $\beta$ if applicable) can be fitted to the measured data, and therefrom $f_s$ can be calculated for any values of I or S using Eqs. (23-28) or Eqs. (28-31).

d) Coil Calibration by Calculating Function $f_s$

For a given and well-known set of parameters $\rho$, $\delta$, and $\beta$, function $f_s$ (and thus $f_s'$) may be determined solely by calculating $f_s = f_s(4\phi_F)$ according to the set of equations given above.

e) Influence of Temperature

The fiber coil discussed above is inherently temperature compensated, i.e. no extra measures are needed with regard to temperature for calibration.

Fiber coils not inherently temperature compensated may be equipped with one or several extra temperature sensors. The temperature dependence of the scaling functions $f_s = f_s(I, T_s)[f_s' = f_s'(S, T_s)]$ is then taken into account in the same way as the temperature dependence of function $f_e$ (or $f_e'$).

3.3 Effect of Wavelength of Operation

The Verdet constant V is a function of wavelength. In good approximation V may be written as $V(\lambda) = (\lambda_o/\lambda)^2 V(\lambda_o)$. The parameter $g = k \cdot V(\lambda) \cdot N$ defined above is thus determined using, apart from the parameters k and N, the known Verdet constant at a reference wavelength $\lambda_o$ and the actual wavelength $\lambda$ of the light source. Commonly the light source is a broadband semiconductor source such as a superluminescent diode. Here, $\lambda$ is the center of gravity wavelength for the given spectrum. This wavelength is affected by the source temperature and drive current and, if not kept constant, these parameters must also be taken into account.

As mentioned above, functions $f_e$, $f_e'$ and $f_s$, $f_s'$ also change somewhat with wavelength. The corresponding effect may be derived from theoretical considerations and included in the above procedures. Alternatively, the overall wavelength dependence may be determined experimentally for a given type of sensors (including the wavelength dependences of $f_e$, $f_e'$ and $f_s$, $f_s'$ as well as of the Verdet constant V). This results in a common wavelength coefficient $L(\lambda)$. The parameter g is then given as $g = L(\lambda) \cdot k \cdot V(\lambda_o) \cdot N$.

3.4 Storage of Calibration Data

The calibration data of measuring unit 1 including the information on the source wavelength as well as the calibration data of the sensing head including the number of fiber loops are stored in a first memory 22 of the measuring unit 1. The calibration data of sensor head 2, including the number of fiber loops, may also be stored in a second memory 23 attributed to sensor head 2, e.g. in an Erasable Programmable Read Only Memory (EPROM).

Advantageously, first memory 22 is arranged in measuring unit 1. Second memory 23 is part of the sensing head 2, i.e. it is physically connected to sensing head 2. Second memory 23 can e.g. be located at the control unit end of the polarization maintaining fiber cable 15 connecting the coil with the measuring unit.

If the measuring unit or the sensor head is exchanged, the measuring unit reads the coil data and reconfigures itself with the new data. Apart from calibration data EPROM 23 may contain further parameters such as the optical loss in the sensor head and fiber cable length.

4. Notes

The measuring unit and the sensor head may be separated from each other or rejoined by means of one or several fiber connectors along the connecting fiber cable. Alternatively, the fiber may be spliced by means of a fusion splicer.

In part the above calibration concepts may be applied to other types of fiber-optic current sensors, particularly Sagnac type interferometric current sensors [1] or polarimetric current sensors where the Faraday effect is observed as a polarization rotation of linearly polarized light [8].

While there are shown and described presently exemplary embodiments of the invention, it is to be distinctly understood that the invention is not limited thereto but may be otherwise variously embodied and practiced within the scope of the following claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

1. K. Bohnert, G. Gabus, J. Nehring, and H. Brändle, "Temperature and vibration insensitive fiber-optic current sensor", J. of Lightwave Technology 20(2), 267-276 (2002).
2. K. Bohnert, H. Brändle, M. Brunzel, P. Gabus, and P. Guggenbach, "Highly accurate fiber-optic dc current sensor for the electro-winning industry", IEEE/IAS Transactions on Industry Applications 43(1), 180-187, 2007.
3. K. Bohnert, P. Gabus, J. Nehring, H. Brändle, M. Brunzel, "Fiber-optic high current sensor for electrowinning of metals", Journal of Lightwave Technology, 25(11), 3602-3609, 2007.
4. EP 1 115 000
5. EP 1 154 278
6. EP 1 512 981
7. WO2005/111633
8. Y. N. Ying, Z. P. Wang, A. W. Palmer, K. T. V. Grattan, D. A. Jackson, Rev. Sci. Instruments 66, 3097, 1995.
9. R. A. Bergh, H. C. Lefevre, and H. J. Shaw, "An overview of fiber-optic gyroscopes", J. Lightw. Technol., 2 (2), 91-107, 1984.
10. "The fiber-optic gyroscope", Nerve Lefevre, Artech House, Boston, London, 1993.
11. M. Lawrence, Lithium niobate integrated optics, Reports on Progress in Physics, 363-429, 1993.
12. EP 1 107 029
13. R. I. Laming and D. N. Payne, "Electric current sensors employing spun highly birefringent optical fibers", J. Lightw. Technol., 7(12), 2084-2094, 1989.

REFERENCE NUMBERS

1: measuring unit
2: sensor head
3: light source
4: modulator
5: 90° splice
6: fiber coupler
10: retarder
11: sensing fiber
12: conductor
13: reflector
15: polarization maintaining fiber, polarization maintaining fiber cable
16: fiber connector
18: differential phase modulator
19: fiber coupler
20: fiber polarizer
21: 1×3 fiber coupler
22, 23: memory
a, b: interference fringe parameters (FIG. 6)
$a_e$, $b_e$: interference fringe parameters for measuring unit
$a_s$, $b_s$: interference fringe parameters for sensing head
$f_c$, $f_c'$: normalized scaling functions
$f_e$, $f_e'$: measuring unit scaling functions
$f_s$, $f_s'$: sensing head scaling functions
F, $F^{-1}$: function, inverse function
g: 4 k V N
h: p·a
$h_s$, $h_e$: h for sensing head, measuring unit, respectively
I: current
$I_o$: selected current
k: factor
N: number of sensing fiber loops
p: parameter, typically 1
R: loop radius
r: fiber radius
S: signal, raw signal
$S_o$: signal at current $I_o$
$T_e$: measuring unit temperature
$T_o$: reference temperature
$T_s$: sensor head temperature
U: see eq. (9)
V: Verdet constant
v: fringe visibility
β, $β_i$: orientation of polarization-maintaining fiber axes with respect to coil normal and intrinsic birefringence, respectively
Δφ, $φ_F$: phase shifts
δ, $δ_i$: birefringent phase retardation, bend induced and intrinsic
ε: offset of retarder from 90° retardation
γ: see eq. (10)
λ: wavelength
$λ_o$: reference wavelength

What is claimed is:

1. A method for operating a fiber-optic current sensor measuring a current I in a conductor, wherein the current sensor includes:
   a sensor head having a sensing fiber wound around the conductor and a retarder connected to the sensing fiber;
   a measuring unit having a light source and a light detector; and
   a polarization maintaining fiber connecting the sensor head to the measuring unit,
   wherein the method comprises:
   sending light from the light source through the sensor head;

measuring, by means of the light detector, a signal S derived from light returning from the sensor head; and
calculating the current I from $$I=(S/g) \cdot f_e'(S) \cdot f_s'(S)$$

wherein:
$f_e'(S)$ is a scaling function of the measuring unit depending on the signal S;
$f_s'(S)$ is a scaling function of the sensor head depending on the signal S; and
g is a constant independent of the signal S,
wherein a phase shift $\Delta\phi$ is measured in the sensing fiber of the sensor head, and the sensor head scaling function $f_s'$ is defined by $\Delta\phi/(4\phi_F)$, where $4\phi_F$ is a defined phase shift.

2. The method of claim 1, comprising:
determining the measuring unit scaling function $f_e'$ independently from the sensor head scaling function $f_s'$.

3. A method for operating a fiber-optic current sensor measuring a current I in a conductor, wherein the current sensor includes:
a sensor head having a sensing fiber wound around the conductor and a retarder connected to the sensing fiber;
a measuring unit having a light source and a light detector; and
a polarization maintaining fiber connecting the sensor head to the measuring unit,
wherein the method comprises:
sending light from the light source through the sensor head;
measuring, by means of the light detector, a signal S derived from light returning from the sensor head; and
calculating the current I from $$I=(S/g) \cdot f_e'(S) \cdot f_s'(S)$$

wherein:
$f_e'(S)$ is a scaling function of the measuring unit depending on the signal S;
$f_s'(S)$ is a scaling function of the sensor head depending on the signal S; and
g is a constant independent of the signal S,
wherein the measuring unit scaling function $f_e'$ is a function of the signal S as well as of temperature $T_e$, wherein the measuring unit scaling function $f_e'$ is determined by:
measuring, for at least one current value, the signal S as a function of current at a given temperature $T_o$, to obtain the measuring unit scaling function $f_e'(S, T_o)$;
measuring, for at least one temperature other than the given temperature $T_o$, the signal S at a given current $I_o$, to obtain the function $f_e'(S_o, T_e)$; and
approximating the measuring unit scaling function $f_e'$ by $f_e'(S, T_e) = f_e'(S, T_o) \cdot f_e'(S_o, T_e)/f_e'(S_o, T_o)$.

4. The method of claim 1, wherein the measuring unit scaling function $f_e'$ is a function of the signal S as well as of temperature $T_e$, and
wherein the measuring unit scaling function $f_e'$ is determined by:
measuring, for a plurality of current and temperature values, values of the signal S; and
storing the values of the measuring unit scaling function $f_e'$ in a look-up table.

5. The method of claim 1, comprising: the step of determining the measuring unit scaling function $f_e'$ by:
connecting the measuring unit to a reference sensor head having a known sensor head scaling function $f_s'$, and
measuring the signal S for at least one current sensed by the reference sensor head.

6. The method of claim 5, wherein the sensor head scaling function $f_s'$ of the reference sensor head is equal to 1, independent of the current I.

7. The method of claim 5, wherein the measuring unit comprises a phase modulator, and wherein the measuring unit scaling function $f_e'$ is determined by:
connecting the measuring unit to the reference sensor head;
operating the modulator for introducing a phase shift between light polarizations generated by the measuring unit, thereby generating interference fringes at the light detector; and
measuring an interference fringe visibility of the interference fringes.

8. The method of claim 7, wherein the measuring unit scaling function $f_e'$ is approximated by $f_e'(S)=1/[f_e'(S/k)]$, with $f_e = \Delta\phi(4\phi_F)$, $$\Delta\phi = \arctan\frac{2U}{1-U^2},$$

$$U = \frac{\tan(2\varphi_F)}{\cos\gamma},$$

$$\cos\gamma = (1/h),$$

and
$4\phi_F = 4 \cdot V \cdot N \cdot I$, where V is the Verdet constant of the sensing fiber, and N is the number of sensing fiber loops around the conductor,
wherein k is a constant, and h is a measured parameter based on the measured interference fringe visibility, and
wherein h is an offset from unit of function $f_e$ at temperature Te.

9. The method of claim 8,
wherein the measured parameter h is measured from the interference fringe visibility.

10. The method of claim 8, wherein the measured parameter h is determined by:
connecting the measuring unit to a sensor head having a sensing head scaling function $f_s'=1$ and having a coil wound around a conductor;
sending the current I through the conductor for measuring the sensor signal S and determining the parameter h from the signal S.

11. The method of claim 8, wherein the measured parameter h is determined by determining a polarization cross-talk in the measuring unit.

12. The method of claim 1, comprising:
determining the sensor head scaling function $f_s'$ by connecting the sensing head to a measuring unit having a known measuring unit scaling function $f_e'$ and measuring the signal S by applying a range of currents and/or temperatures $T_s$ to the sensor head.

13. A method for operating a fiber-optic current sensor measuring a current I in a conductor, wherein the current sensor includes: a sensor head having a sensor fiber wound around the conductor and a retarder connected to the sensing fiber;
a measuring unit having a light source and a light detector; and
a polarization maintaining fiber connecting the sensor head to the measuring unit,
wherein the method comprises:
sending light from the light source through the sensor head;
measuring, by means of the light detector, a signal S derived from light returning from the sensor head; and
calculating the current I from $I=(S/g) \cdot fe'(S) \cdot f'(S)$
wherein:

fe'(S) is a scaling function of the measuring unit depending on the signal S;

fs'(S) is a scaling function of the sensor head depending on the signal S; and g is a constant depends on the signal S, wherein the sensor head scaling function fs' is approximated by fs'(S)=1/[fe(S/k)], with fe=Δφ(4φ$_F$), k is a constant, and $$\Delta\phi = \arctan\frac{2U}{1-U^2},$$

$$U = \frac{2\varphi_F \frac{\tan\Gamma}{\Gamma}}{\cos\varepsilon - \delta'\sin\varepsilon\sin[2(\beta+\psi)]\frac{\tan\Gamma}{\Gamma}}$$

$$\delta' = \{\delta^2 + \delta_i^2 + 2\delta\delta_i\cos[2(\beta_i-\beta)]\}^{1/2}$$

$$\Gamma = [\delta'^2 + (2\varphi_F)^2]^{1/2},$$

unit, and wherein 4φ$_F$ denotes a magneto optic phase shift in the sensing fiber, (2φ$_F$)² denotes a Faraday phase shift, δ and δi denote the birefringent phase retardation in the sensing fiber due to bend-induced and intrinsic birefringence, respectively, β and βi are the angles between a principal axis of the polarization-maintaining fiber and slow axes of a bend-induced and an intrinsic birefringence, respectively, of the sensing fiber, "ε" is an offset of a retarder from 90° retardation.

14. A method for operating a fiber-optic current sensor measuring a current I in a conductor, wherein the current sensor includes:

a sensor head having a sensing fiber wound around the conductor and a retarder connected to the sensing fiber;

a measuring unit having a light source and a light detector; and a polarization maintaining fiber connecting the sensor head to the measuring unit, wherein the method comprises:

sending light from the light source through the sensor head;

measuring, by means of the light detector, a signal S derived from light returning from the sensor head; and calculating the current I from $$I=(S/g)\cdot f_e'(S)\cdot f_s'(S)$$

wherein:

$f_e'(S)$ is a scaling function of the measuring unit depending on the signal S;

$f_s'(S)$ is a scaling function of the sensor head depending on the signal S; and g is a constant independent of the signal S, wherein the measuring unit comprises a phase modulator, and wherein the sensing head scaling function $f_s'$ is determined by:

connecting the sensing head to a measuring unit having a known measuring unit scaling function $f_e'$;

operating the modulator of the measuring unit for introducing a phase shift between light polarizations generated by the measuring unit, thereby generating interference fringes at the light detector; and measuring an interference fringe visibility of the interference fringes.

15. A fiber-optic current sensor for measuring a current I in a conductor, the sensor comprising:

a sensor head having a sensing fiber wound around the conductor and a retarder connected to the sensing fiber;

a measuring unit including a light source and a light detector; and a polarization maintaining fiber connecting the sensor head to the measuring unit;

a first memory attributed to the measuring unit for storing the measuring unit scaling function $f_e'$; and a second memory attributed to the sensor head for storing the sensor head scaling function $f_s'$, wherein:

the light source is configured to send light through the sensor head;

the light detector is configured to measure a signal S derived from light returning from the sensor head, and the current I is calculated from $$I=(S/g)\cdot f_e'(S)\cdot f_s'(S)$$

wherein:

$f_e'(S)$ is a scaling function of the measuring unit depending on the signal S;

$f_s'(S)$ is a scaling function of the sensor head depending on the signal S; and g is a constant independent of the signal S, wherein the measuring unit is configured to measure a phase shift Δφ in the sensing fiber of the sensor head, and the sensor head scaling function $f_s'$ is defined by Δφ/(4φ$_F$), where 4φ$_F$ is a defined phase shift.

16. The fiber-optic current sensor of claim 15 wherein the first memory is part of the measuring unit, and/or the second memory is part of the sensing head.

17. A method for operating a fiber-optic current sensor measuring a current I in a conductor, wherein the current sensor includes:

a sensor head having a sensing fiber wound around the conductor and a retarder connected to the sensing fiber;

a measuring unit having a light source and a light detector; and a polarization maintaining fiber connecting the sensor head to the measuring unit wherein the method comprises:

sending light from the light source through the sensor head;

measuring, by means of the light detector, a signal S derived from light returning from the sensor head; and calculating the current I from $$I=(S/g)\cdot f_e'(S)\cdot f_s'(S)$$

wherein:

$f_e'(S)$ is a scaling function of the measuring unit depending on the signal S;

$f_s'(S)$ is a scaling function of the sensor head depending on the signal S; and g is a constant independent of the signal S, wherein a phase shift Δφ is measured in the sensing fiber of the sensor head, and the sensor head scaling function $f_s'$ is defined by Δφ/(4φ$_F$), where 4φ$_F$ is a defined phase shift, wherein the method comprises determining the measuring unit scaling function $f_e'$ independently from the sensor head scaling function $f_s'$, and wherein the measuring unit scaling function $f_e'$ is a function of the signal S as well as of temperature $T_e$, wherein the measuring unit scaling function $f_e'$ is determined by:

measuring, for at least one current value, the signal S as a function of current at a given temperature $T_o$, to obtain the measuring unit scaling function $f_e'(S, T_o)$;

measuring, for at least one temperature other than the given temperature $T_o$, the signal S at a given current $I_o$, to obtain the function $f_e'(S_o, T_e)$; and approximating the measuring unit scaling function $f_e'$ by $f_e'(S, T_e) = f_e'(S, T_o) \cdot f_e'(S_o, T_e) / f_e'(S_o, T_o)$.

18. The method of claim 2, wherein the measuring unit scaling function $f_e'$ is a function of the signal S as well as of temperature $T_e$, and
wherein the measuring unit scaling function $f_e'$ is determined by:
measuring, for a plurality of current and temperature values, values of the signal S; and
storing the values of the measuring unit scaling function $f_e'$ in a look-up table.

19. The method of claim 17, comprising: the step of determining the measuring unit scaling function $f_e'$ by:
connecting the measuring unit to a reference sensor head having a known sensor head scaling function $f_s'$, and
measuring the signal S for at least one current sensed by the reference sensor head.

20. The method of claim 18, comprising: the step of determining the measuring unit scaling function $f_e'$ by:
connecting the measuring unit to a reference sensor head having a known sensor head scaling function $f_s'$, and
measuring the signal S for at least one current sensed by the reference sensor head.

21. The method of claim 6, wherein the measuring unit comprises a phase modulator, and wherein the measuring unit scaling function $f_e'$ is determined by:
connecting the measuring unit to the reference sensor head;
operating the modulator for introducing a phase shift between light polarizations generated by the measuring unit, thereby generating interference fringes at the light detector; and
measuring an interference fringe visibility of the interference fringes.

22. The method of claim 8, wherein the measured parameter h is measured from the interference fringe visibility.

23. The method of claim 10, wherein the measured parameter h is determined by determining a polarization cross-talk in the measuring unit.

24. The fiber-optic current sensor of claim 16, wherein the second memory is located at a control unit end of the polarization maintaining fiber.

25. The method of claim 13, wherein $\delta_i = 0$.

26. A method for operating a fiber-optic current sensor measuring a current I in a conductor, wherein the current sensor includes:
a sensor head having a sensing fiber wound around the conductor and a retarder connected to the sensing fiber;
a measuring unit having a light source and a light detector; and
a polarization maintaining fiber connecting the sensor head to the measuring unit,
wherein the method comprises:
sending light from the light source through the sensor head;
measuring, by means of the light detector, a signal S derived from light returning from the sensor head; and
calculating the current I from $$I = (S/g) \cdot f_e'(S) \cdot f_s'(S),$$

wherein:
$f_e'(S)$ is a scaling function of the measuring unit depending on the signal S;
$f_s'(S)$ is a scaling function of the sensor head depending on the signal S; and
g is a constant independent of the signal S,
wherein the measuring unit scaling function $f_e'$ is approximated by $f_e'(S) = 1/[f_e'(S/k)]$, with $f_e = \Delta\phi/(4\phi_F)$, $$\Delta\phi = \arctan \frac{2U}{1 - U^2},$$

$$U = \frac{\tan(2\varphi_F)}{\cos\gamma},$$

$$\cos\gamma = (1/h),$$

and
$4\phi_F = 4 \cdot V \cdot N \cdot I$, where V is the Verdet constant of the sensing fiber, and N is the number of sensing fiber loops around the conductor,
wherein k is a constant, and h is a measured parameter based on an interference fringe visibility of the light detector of the measuring unit.

27. A method for operating a fiber-optic current sensor measuring a current I in a conductor, wherein the current sensor includes:
a sensor head having a sensing fiber wound around the conductor and a retarder connected to the sensing fiber;
a measuring unit having a light source and a light detector; and
a polarization maintaining fiber connecting the sensor head to the measuring unit,
wherein the method comprises:
sending light from the light source through the sensor head;
measuring, by means of the light detector, a signal S derived from light returning from the sensor head; and
calculating the current I from $$I = (S/g) \cdot f_e'(S) \cdot f_s'(S),$$

wherein:
$f_e'(S)$ is a scaling function of the measuring unit depending on the signal S;
$f_s'(S)$ is a scaling function of the sensor head depending on the signal S; and
g is a constant independent of the signal S,
wherein the measuring unit comprises a phase modulator,
wherein the measuring unit scaling function $f_e'$ is determined by:
connecting the measuring unit to a reference sensor head having a known sensor head scaling function $f_s'$;
measuring the signal S for at least one current sensed by the reference sensor head;
operating the modulator for introducing a phase shift between light polarizations generated by the measuring unit, thereby generating interference fringes at the light detector; and
measuring an interference fringe visibility of the interference fringes.

28. A fiber-optic current sensor for measuring a current I in a conductor, the sensor comprising:
a sensor head having a sensing fiber wound around the conductor and a retarder connected to the sensing fiber;
a measuring unit including a light source and a light detector; and
a polarization maintaining fiber connecting the sensor head to the measuring unit;
a first memory attributed to the measuring unit for storing the measuring unit scaling function $f_e'$; and
a second memory attributed to the sensor head for storing the sensor head scaling function $f_s'$, wherein:
the light source is configured to send light through the sensor head;
the light detector is configured to measure a signal S derived from light returning from the sensor head, and
the current I is calculated from $$I = (S/g) \cdot f_e'(S) \cdot f_s'(S)$$

wherein:
$f_e'(S)$ is a scaling function of the measuring unit depending on the signal S;
$f_s'(S)$ is a scaling function of the sensor head depending on the signal S; and
g is a constant independent of the signal S,
wherein the measuring unit scaling function $f_e'$ is a function of the signal S as well as of temperature $T_e$, wherein the measuring unit scaling function $f_e'$ is determined by:
measuring, for at least one current value, the signal S as a function of current at a given temperature $T_o$, to obtain the measuring unit scaling function $f_e'(S, T_o)$;
measuring, for at least one temperature other than the given temperature $T_o$, the signal S at a given current $I_o$, to obtain the function $f_e'(S_o, T_e)$; and
approximating the measuring unit scaling function $f_e'$ by $f_e'(S, T_e) = fe(S, T_o) \cdot f_e(S_o, T_e) / f_e'(S_o, T_o)$.

* * * * *